(12) United States Patent
Eshleman et al.

(10) Patent No.: US 10,992,207 B2
(45) Date of Patent: Apr. 27, 2021

(54) ELECTRIC STATIC DISCHARGE PROTECTION FOR POWER TOOLS

(71) Applicant: BLACK & DECKER INC., New Britain, CT (US)

(72) Inventors: Scott J. Eshleman, Parkville, MD (US); Shailesh P. Waikar, Perry Hall, MD (US); Ganapati K. Pai, Baltimore, MD (US); Joseph Narbut, Parkville, MD (US)

(73) Assignee: BLACK & DECKER INC., New Britain, CT (US)

( * ) Notice: Subject to any disclaimer, the term of this patent is extended or adjusted under 35 U.S.C. 154(b) by 185 days.

(21) Appl. No.: 16/436,138

(22) Filed: Jun. 10, 2019

(65) Prior Publication Data
US 2019/0393761 A1 Dec. 26, 2019

Related U.S. Application Data

(60) Provisional application No. 62/688,098, filed on Jun. 21, 2018.

(51) Int. Cl.
| | |
|---|---|
| *H02K 11/26* | (2016.01) |
| *H02K 7/14* | (2006.01) |
| *H02K 11/33* | (2016.01) |
| *B23Q 11/04* | (2006.01) |
| *B23D 59/00* | (2006.01) |
| *B23D 47/12* | (2006.01) |
| *B23D 45/04* | (2006.01) |

(52) U.S. Cl.
CPC ............. *H02K 11/26* (2016.01); *B23Q 11/04* (2013.01); *H02K 7/145* (2013.01); *H02K 11/33* (2016.01); *B23D 45/048* (2013.01); *B23D 47/12* (2013.01); *B23D 59/006* (2013.01)

(58) Field of Classification Search
CPC ........ H02K 11/33; H02K 7/145; B23Q 11/04; B23D 45/048; B23D 47/12; B23D 59/006
USPC .......................................................... 310/50
See application file for complete search history.

(56) References Cited

U.S. PATENT DOCUMENTS

| | | | |
|---|---|---|---|
| 9,013,842 B2* | 4/2015 | Domanski | H01L 27/0285 361/56 |
| 2017/0288585 A1* | 10/2017 | Pant | H02P 27/08 |

FOREIGN PATENT DOCUMENTS

| | | |
|---|---|---|
| EP | 1104224 A1 | 5/2001 |
| WO | 2016138961 A1 | 9/2016 |
| WO | 2017210091 A1 | 12/2017 |
| WO | WO-2019122032 A1 * 6/2019 | ............. H02K 11/26 |

\* cited by examiner

*Primary Examiner* — Forrest M Phillips
(74) *Attorney, Agent, or Firm* — Adan Ayala

(57) ABSTRACT

A power tool has a housing, a motor disposed within the housing, a power supply circuit for providing power to the motor, a controller circuit for controlling the power provided to the motor, and an electric static discharge (ESD) protection circuit connected to the power supply circuit and the housing. The ESD protection circuit includes a first resistor connected to the power supply circuit and the housing. The first resistor may be a high impedance resistor. The ESD protection circuit may also have a first capacitor connected in parallel to the first resistor, a second resistor connected in series to the first resistor, and a second capacitor connected in series to the first capacitor and in parallel to the second resistor.

9 Claims, 2 Drawing Sheets

ELECTRIC STATIC DISCHARGE PROTECTION FOR POWER TOOLS

CROSS-REFERENCE TO RELATED APPLICATIONS

The following application derives priority from U.S. Application Ser. No. 62/688,098, filed on Jun. 21, 2018 and titled "ELECTRIC STATIC DISCHARGE PROTECTION FOR POWER TOOLS", which is incorporated herein by reference.

FIELD

The present invention relates to electric static discharge (ESD) protection system, and more particularly ESD protection systems for power tools.

BACKGROUND

Many power tools rotate or vibrate a tool accessory, such as a drill bit, a saw blade, sandpaper, etc., to cut or remove material. These accessories typically operate at a high rate of speed and rub against the material surfaces they intend to alter. This rubbing action can build up significant static charge on power tool surfaces relative to earth ground. Similarly, particles moving through air through the power tool or vacuum hose surfaces can also build significant static charge.

This static charge is problematic because, if the charge is high enough, it can jump air gaps within the power tool and possibly damage electronic components within the power tool.

Prior art solutions include using anti-static/conductive paints or coatings on vacuum hoses. However such paints and coatings may leave marks on surfaces when the vacuum hoses are dragged along such surfaces.

DESCRIPTION OF THE DRAWINGS

Preferred embodiments of the invention will now be described, by way of example, with reference to the accompanying drawings, of which.

DETAILED DESCRIPTION

Figure 1:
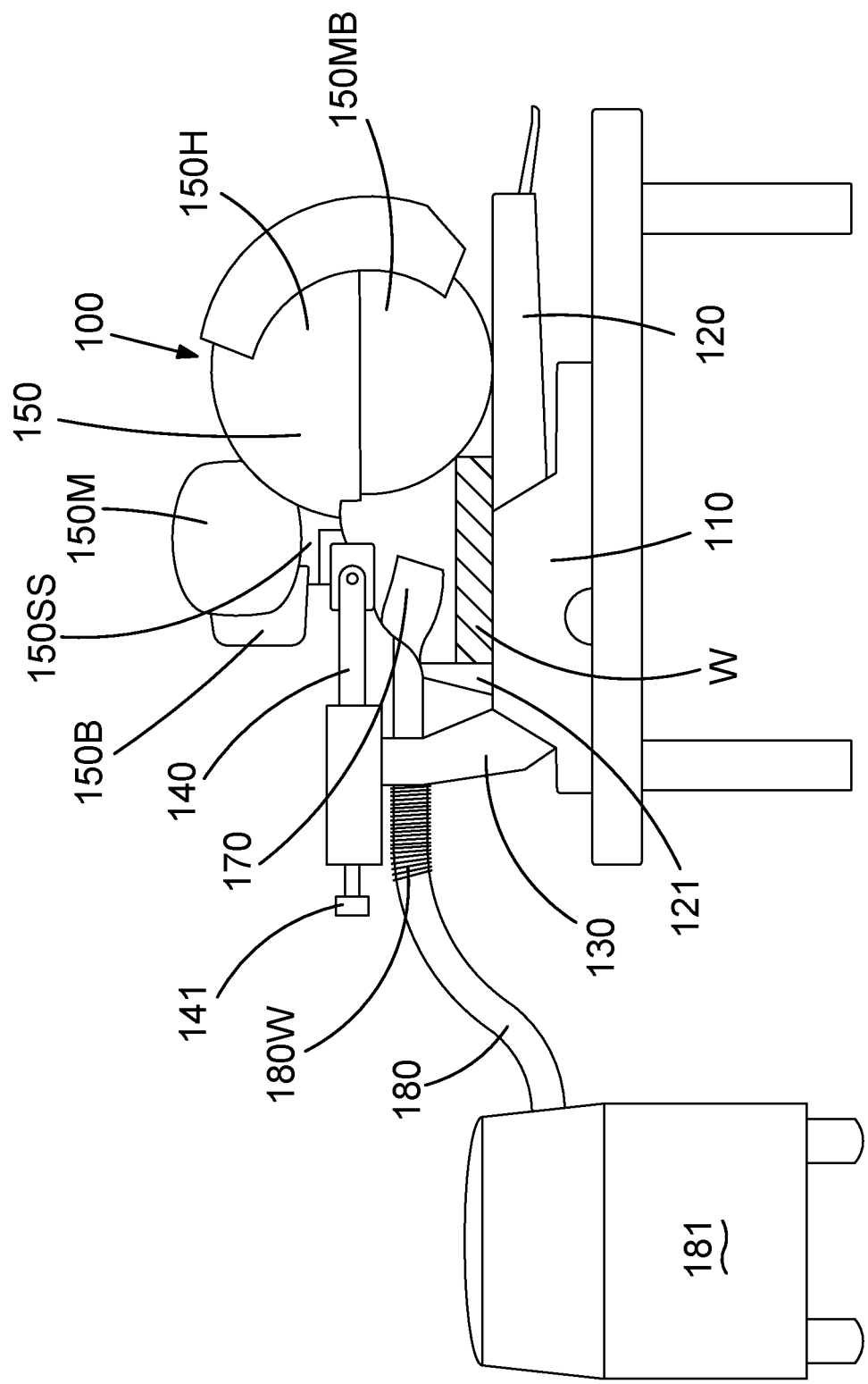
FIG. 1 is a side view of the tool according to the invention.

Referring now to the drawings, a power tool, such as miter saw 100, which has a base assembly 110, a table 120 rotatably disposed on the base assembly 110, a support section 130 rotatably connected to the table 120, at least one guide bar 140 fixedly attached to or sliding along the support section 130, and a saw assembly 150 sliding along or fixedly attached to the guide bar(s) 140. If multiple guide bars 140 are used, it is preferable to attach an end cap 141 to the ends of the guide bars 140 in order to ensure parallel alignment between the guide bars 140.

The saw assembly 150 preferably has a saw support section 150SS fixedly attached to the guide bar(s) 140, a saw assembly housing 150H pivotably attached to the saw support section 150SS, a motor 150M supported by the saw assembly housing 150H, and a saw blade 150MB disposed on an arbor (not shown) and driven by motor 150M. Persons skilled in the art will recognize that saw assembly housing 150H (and thus saw blade 150MB) may be pivoted downwardly for cutting a workpiece W disposed on the table 120. Saw assembly housing 150H may have a handle (not shown) for sliding the saw assembly 150 relative to support section 130 and/or for downwardly pivoting the saw assembly housing 150H.

Persons skilled in the art will recognize that workpiece W may be placed against a fence 121 which is preferably attached to base assembly 110 and/or table 120.

Miter saw 100 may be powered by AC power and/or power tool battery pack(s) 150B. Persons skilled in the art will recognize that miter saw 100 may receive AC power having a voltage between 120 volts and 240 volts. Similarly, miter saw 100 may receive DC power from the battery pack(s) 150B having a total voltage between 15 volts and 250 volts.

Figure 2:
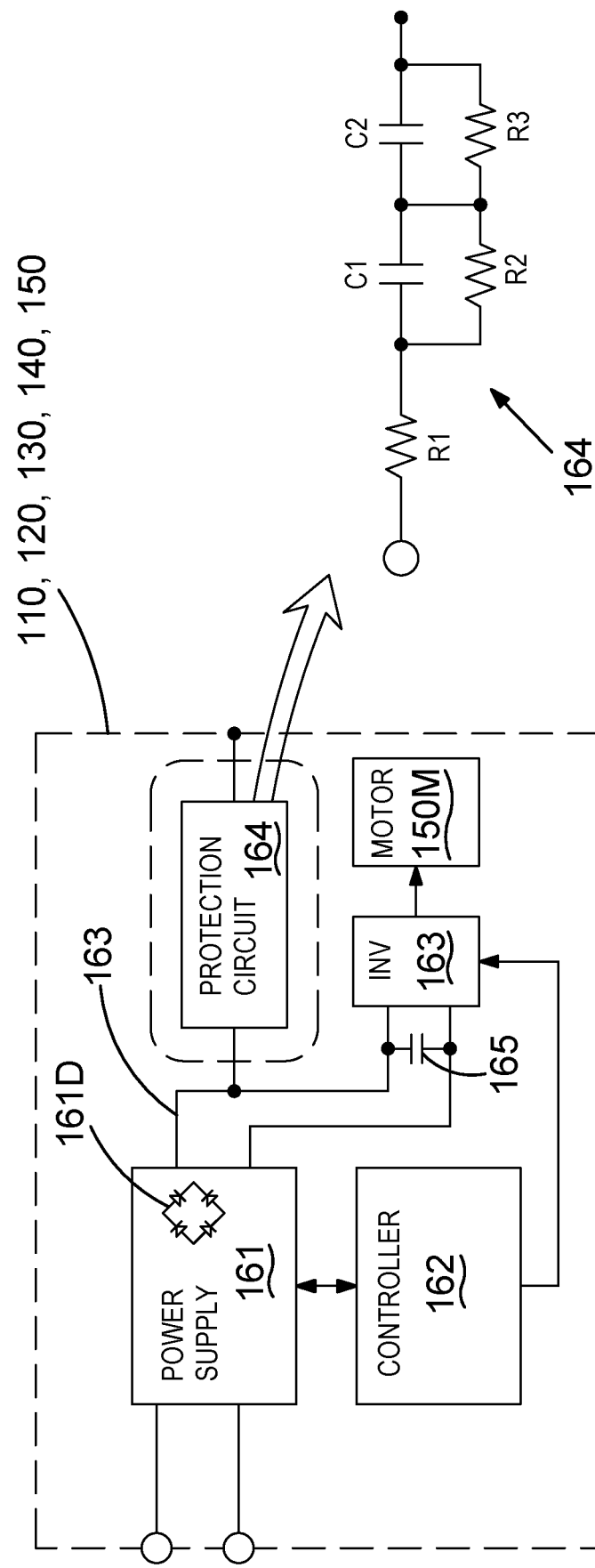
FIG. 2 is a block diagram with the main electronic components of the tool, along with a schematic diagram of a protection circuit within the tool.

Referring to FIG. 2, the AC power and/or the power received from power tool battery pack(s) 150B may be processed by a power supply circuit 161, which supplies power to motor 150M. Power supply circuit 161 may have a bridge rectifier for converting the AC power into DC. A DC power converter then can lower the voltage to be used by different components within miter saw 100. Power supply circuit 161 may have IGBT or MOSFET transistors or high power diodes 161D.

The power supplied by power supply circuit 161 may supplied to an inverter circuit 163 for converting DC power supplied by power supply circuit 161 to AC power. Such AC power is then supplied to motor 150M. A capacitor 165 may be disposed between power supply circuit 161 and inverter circuit 163 to smoothen out the output of power supply circuit 161.

A controller circuit 162 preferably controls the amount of power provided to motor 150M by interacting with or controlling the power supply circuit 161 and/or inverter circuit 163.

Power supply circuit 161 may have at least one power line 163. Such power line(s) 163 may distribute DC power. It may be preferable to provide an ESD protection circuit 164 on power line 163.

Protection circuit 164 contains at least one resistor R1 disposed between power line 163 and at least one of the base assembly 110, table 120, support section 130, guide bar(s) 140, and saw assembly 150. Resistor R1 will preferably dissipate the electric static charge and prevent a damaging ESD. Other resistors R2, R3 may be connected in series to resistor R1. In the exemplary protection circuit 164 shown in FIG. 2, resistor R1 is a low impedance resistor that helps the circuit comply with electromagnetic compatibility (EMC) requirements. Resistors R2, R3 are the high impedance resistors intended to provide the discharge path back to potential ground.

It may also be advantageous to connect at least one capacitor C1 in parallel with resistor R2. Preferably a second capacitor C2 is connected in series with capacitor C1 and connected in parallel to resistor R3.

Such arrangement provides a path for ESD actually jumping to at least one of the base assembly 110, table 120, support section 130, guide bar(s) 140, and saw assembly 150. The added capacitor(s) C1, C2 preferably provide a low impedance path to electronic components that are more immune to ESD, such as the capacitor 165, instead of directly flowing to IGBT or MOSFET transistors or high power diodes 161D in power supply circuit 161. Persons skilled in the art will recognize that the ESD could travel through capacitors C1, C2, through capacitor 165, and then towards the IGBT or MOSFET transistors or high power diodes 161D along power line 163.

Preferably the values of the components are as follow:

| | |
|---|---|
| R1 | 360 Ω |
| R2 | 1 MΩ |
| R3 | 1 MΩ |
| C1 | 4.7 nF |
| C2 | 4.7 nF |

This arrangement is useful even if the static charge build-up occurs on a separate device connected to miter saw 100. Referring to FIG. 1, miter saw 100 may have a dust collector 170, which is connected to a hose 180, which in turn may be connected to a vacuum 181. As mentioned above, particles moving through air through the hose 180 can build significant static charges in hose 180. These static charges can be discharged unto miter saw 100. Protection circuit 164 (and in particular capacitors C1 and/or C2) provide a low impedance path to electronic components that are more immune to ESD so as to minimize any possible damage to more sensitive components.

Persons skilled in the art will recognize that hose 180 may be electrically connected to at least one of the base assembly 110, table 120, support section 130, guide bar(s) 140, and saw assembly 150 to prevent a build-up of static charge. Such electric connection may be accomplished through conductive coatings on hose 180 contacting at least one of the base assembly 110, table 120, support section 130, guide bar(s) 140, and saw assembly 150. Alternatively, a wire 180W may be wrapped around hose 180 and electrically connected to at least one of the base assembly 110, table 120, support section 130, guide bar(s) 140, and saw assembly 150.

It will be understood that the above description and the drawings are examples of particular implementations of the invention, but that other implementations of the invention are included in the scope of the claims.

What is claimed is:

1. A power tool comprising:
   a housing,
   a motor disposed within the housing,
   a power supply circuit for providing power to the motor,
   a controller circuit for controlling the power provided to the motor, and
   an electric static discharge (ESD) protection circuit connected to the power supply circuit and the housing, wherein the ESD protection circuit comprises:
     a first resistor connected to the power supply circuit and the housing, the first resistor being a high impedance resistor;
     a first capacitor connected in parallel to the first resistor;
     a second resistor connected in series to the first resistor; and
     a second capacitor connected in series to the first capacitor and in parallel to the second resistor.

2. The power tool of claim 1, further comprising a third resistor connected in series to the first resistor and the power supply circuit.

3. The power tool of claim 2, wherein the third resistor is a low impedance resistor.

4. A power tool comprising:
   a housing,
   a motor disposed within the housing,
   a power supply circuit for providing power to the motor,
   a controller circuit for controlling the power provided to the motor, and
   an electric static discharge (ESD) protection circuit connected to the power supply circuit and the housing, wherein the ESD protection circuit comprises a first resistor connected to the power supply circuit and the housing, the first resistor being a low impedance resistor.

5. The power tool of claim 4, further comprising a first capacitor connected in series to the first resistor.

6. The power tool of claim 5, further comprising a second resistor connected in series to the first resistor, and in parallel to the first capacitor.

7. The power tool of claim 6, wherein the second resistor is a high impedance resistor.

8. The power tool of claim 6, further comprising a third resistor connected in series to the second resistor, and a second capacitor connected in series to the first capacitor and in parallel to the second resistor.

9. The power tool of claim 8, wherein the third resistor is a high impedance resistor.

* * * * *